(12) United States Patent
To

(10) Patent No.: US 7,418,605 B1
(45) Date of Patent: Aug. 26, 2008

(54) SYSTEM FOR CONTROLLING POWER TO SEQUENTIAL AND COMBINATORIAL LOGIC CIRCUITRY IN AN INTEGRATED CIRCUIT

(75) Inventor: Yat-Loong To, Boulder, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 355 days.

(21) Appl. No.: 11/105,814

(22) Filed: Apr. 13, 2005

(51) Int. Cl.
G06F 1/00 (2006.01)
G06F 1/26 (2006.01)
G06F 1/32 (2006.01)

(52) U.S. Cl. .............. 713/300; 713/320; 713/323; 713/324

(58) Field of Classification Search .......... 713/300, 713/320, 323, 324
See application file for complete search history.

(56) References Cited

U.S. PATENT DOCUMENTS

| | | | |
|---|---|---|---|
| 5,504,910 A * | 4/1996 | Wisor et al. | 713/322 |
| 5,787,294 A * | 7/1998 | Evoy | 713/320 |
| 6,941,479 B1 * | 9/2005 | Sugiura | 713/300 |
| 6,968,469 B1 * | 11/2005 | Fleischmann et al. | 713/324 |
| 2007/0016808 A1 * | 1/2007 | Bhunia et al. | 713/300 |

FOREIGN PATENT DOCUMENTS

EP 0949629 10/1999

OTHER PUBLICATIONS

Uyemura John P., CMOS Logic Circut Design, 2001, Kluwer Academic Publishers, pp. 67-70 and 83-93.*
National Semiconductor, RAM Keep-Alive, May 1980, COP Brief 6, pp. 1-2.*
National Semiconductor, COP410L/COP411L/COP310L/COP311L Single-Chip N-Channel Microcontrollers, Mar. 1992, pp. 1-20.*
American Microsemiconductor, Diode Tutorial, pp. 1-3.*
American Microsemiconductor, Diode Tutorial, Aug. 31, 2000, pp. 1-3.*
Calhoun, Benton H. and Chandraksan, P., Standby Power Reduction Using Dynamic Voltage Scaling and Canary Flip-Flop Structures; IEEE Journal of Solid-State Circuits, vol. 39, No. 9, Sep. 2004, pp. 1504-1511.

* cited by examiner

Primary Examiner—Mark Connolly
(74) Attorney, Agent, or Firm—Farjami & Farjami LLP

(57) ABSTRACT

A method for reducing power consumption in an integrated circuit and an integrated circuit having a power reduction feature. The integrated circuit has at least two functional circuit blocks and two upper supply rails. A first upper supply rail is coupled to the first functional circuit block and a second upper supply rail is coupled to the second functional circuit block. A lower supply rail is coupled to the first and second functional circuit blocks. In an active mode of operation, a first source of operating potential is electrically coupled to the first upper supply rail and a second source of operating potential is electrically coupled to the second upper supply rail. In an idle mode of operation, the first upper supply rail remains electrically coupled to the first source of operating potential and the second source of operating potential is electrically decoupled from the second functional circuit block.

12 Claims, 2 Drawing Sheets

SYSTEM FOR CONTROLLING POWER TO SEQUENTIAL AND COMBINATORIAL LOGIC CIRCUITRY IN AN INTEGRATED CIRCUIT

FIELD OF THE INVENTION

The present invention relates, in general, to integrated circuits and, more particularly, to reducing power consumption in integrated circuits.

BACKGROUND OF THE INVENTION

Integrated circuits such as microprocessors, memory elements, counters, serial adder/subtractors, and the like are typically comprised of subcircuits or functional blocks that communicate with each other through electrical interconnects. For example, the functional blocks of a microprocessor may include a microprocessor core, an integer arithmetic logic unit, an execution core, registers, cache, a floating point unit, an instruction decode and prefetch unit, a branch predictor, a bus interface, and the like. The functional blocks of a memory element, on the other hand, may include charge storage devices, sequential logic circuitry, and combinatorial logic circuitry. The functional blocks in turn comprise active and passive circuit elements such as transistors, capacitors, resistors, and inductors.

In operation, a power or a bias signal is supplied to the integrated circuit before it can receive, process, and transmit electrical signals. The power or bias signal is transmitted to the transistors of each functional block whether the functional blocks are in an active mode of operation or a standby mode of operation. Thus, the circuit elements, e.g., the transistors, receive power whether they are in active operation or not. A drawback of this type of configuration is that all the transistors in the circuit receive operating power, whether or not they are processing electrical signals. Because transistors that are receiving operating power leak current, they consume power. In portable applications such as laptop computers and cellular phones in which power is supplied by batteries, this power consumption limits the amount of time the portable device may be used before it should be recharged or the batteries replaced.

Accordingly, it would be advantageous to have an integrated circuit capable of operating at a reduced power consumption and a method for reducing power consumption of the integrated circuit. It would be of further advantage for the method and structure to be cost efficient.

SUMMARY OF THE INVENTION

The present invention satisfies the foregoing need by providing a method for reducing power consumption in an integrated circuit and an integrated circuit having a power savings feature. In accordance with one aspect, the method comprises providing an integrated circuit having first and second circuit elements. In a first operating state, power is provided to the first and second circuits. In a second operating state, power is removed from the second circuit while continuing to be supplied to the first circuit.

In accordance with another aspect, the present invention comprises a method for operating an integrated circuit. An integrated circuit having first and second circuits coupled to first and second power grids, respectively, is provided. In a first operating state, a first source of operating potential is coupled to the first power grid and a second source of operating potential is electrically coupled to the second power grid. In a second operating state, the second source of operating potential is electrically decoupled from the second power grid while the first source of operating potential remains coupled to the first power grid.

In accordance with yet another aspect, the present invention comprises a method for reducing power consumption in an integrated circuit. An integrated circuit is provided, wherein the integrated circuit comprises a semiconductor substrate having sequential logic circuitry and combinatorial logic circuitry formed therefrom. A first layer of dielectric material is disposed over the semiconductor substrate and a first electrically conductive layer is disposed over the first layer of dielectric material. The integrated circuit further comprises a second layer of dielectric material disposed over the first electrically conductive layer, a first electrically conductive layer coupled to the sequential logic circuitry, and the second electrically conductive layer coupled to the combinatorial logic circuitry. In a first operating state, a first source of operating potential is electrically coupled to the first electrically conductive layer and a second source of operating potential is electrically coupled to the second electrically conductive layer. In a second operating state, the second source of operating potential is electrically decoupled from the second layer of electrically conductive material, while the first source of operating potential remains electrically coupled to the first electrically conductive layer.

In accordance with yet another aspect, the present invention comprises an integrated circuit having first and second functional circuit blocks, and first, second, and third power supply rails. The first and second power supply rails are upper supply rails and the third power supply rail is a lower power supply rail. The first functional circuit block is electrically coupled to the first power supply rail, the second functional circuit block is electrically coupled to the second power supply rail, and the third power supply rail is electrically coupled to at least one of the first and second functional circuit blocks. The first power supply rail is coupled for receiving a first source of operating potential and the second power supply rail is switchably coupled for receiving a second source of operating potential.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a means for saving power in an integrated circuit. In accordance with one aspect of the present invention, the integrated circuit includes sequential logic circuitry and combinatorial logic circuitry in which a first upper power supply rail is coupled to the sequential logic circuitry and a second upper power supply rail is coupled to the combinatorial logic circuitry. The first upper power supply rail is coupled for receiving a source of operating potential $V_{DD1}$ and the second upper power supply rail is coupled for receiving a source of operating potential $V_{DD2}$. The operating potential $V_{DD1}$ that is coupled to the sequential logic circuitry is also referred to as $V_{DD\_STATE}$ and the operating potential $V_{DD2}$ that is coupled to the combinatorial logic circuitry is also referred to as $V_{DD\_COMB}$. A lower power supply rail is commonly coupled to the sequential and combinatorial logic circuitry. Preferably, the voltage level of source of operating potential $V_{DD1}$ is substantially equal to the voltage level of source of operating potential $V_{DD2}$. However, sources of operating potential $V_{DD1}$ and $V_{DD2}$ may be of different voltage values. By way of example the voltage value for sources of operating potential $V_{DD1}$ and $V_{DD2}$ is about 5 volts and the voltage value for source of operating potential $V_{SS}$ is about 0 volts.

Most of the circuitry in an integrated circuit is combinatorial logic circuitry. Thus, powering down this circuitry results in a large power savings. However, because only a small portion of the circuitry is sequential logic circuitry, another benefit is that routing the power grid for the sequential logic circuitry does not use large amounts of semiconductor area and does not entail complicated routing schemes. In other words, because the power grid for the sequential logic circuitry drives a small portion of the overall circuitry, routing the power grid for the sequential logic circuitry can be achieved without consuming large amounts of the semiconductor material and without complicated routing patterns that increase the cost and power consumption of the integrated circuit.

In accordance with another aspect of the present invention, the sequential logic circuitry is coupled to a first source of operating potential $V_{DD1}$ and the combinatorial logic circuitry is switchably coupled to either the first source of operating potential $V_{DD1}$ or a second source of operating potential $V_{DD2}$.

Figure 1:
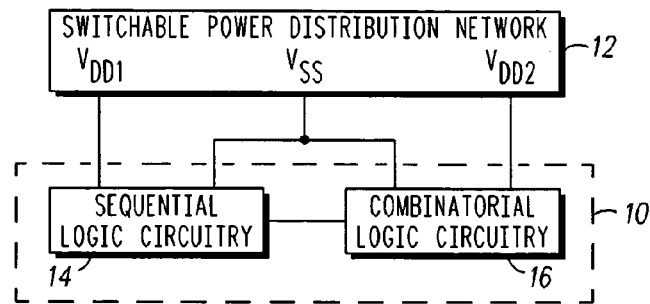
FIG. 1 is a block diagram of an integrated circuit having a switchable power distribution network coupled to sequential logic circuitry and combinatorial logic circuitry in accordance with an embodiment of the present invention.

FIG. 1 is a block diagram of an integrated circuit 10 coupled to a switchable power distribution network 12 in accordance with an embodiment of the present invention. Switchable power distribution network 12 is also referred to as switching circuitry 12. Integrated circuit 10 comprises a sequential logic circuit or sequential logic circuitry 14 coupled to a combinatorial logic circuit or combinatorial logic circuitry 16. An output terminal of sequential logic circuitry 14 is coupled to an input terminal of combinatorial logic circuitry 16. The configuration of sequential logic circuitry 14 and combinatorial logic circuitry 16 is not a limitation of the present invention. Alternatively, the output terminal of combinatorial logic circuitry 16 may be coupled to the input terminal of sequential logic circuitry 14, or sequential logic circuitry 14 may be coupled to combinatorial logic circuitry 16 through additional circuitry (not shown). Examples of the various types of sequential logic circuitry 14 suitable for use with the present invention include flip-flops, latches, Random Access Memory (RAM) cells, registers, counters, and the like. Similarly, examples of the various types of combinatorial logic circuitry 16 include NAND gates, NOR gates, inverter gates, buffer gates, and exclusive-OR (XOR) gates. Although sequential logic circuitry 14 and combinatorial logic circuitry 16 are physically interleaved in an integrated circuit such as integrated circuit 10, for the sake of clarity sequential logic circuitry 14 and combinatorial logic circuitry 16 are shown as being in separate areas of the semiconductor chip.

Sequential logic circuitry 14 is switchably coupled for receiving sources of operating potential such as, for example, $V_{DD1}$ and $V_{DD2}$, from switching circuitry 12 and combinatorial logic circuitry 16 is switchably coupled for receiving source of operating potential $V_{DD2}$ from switching circuitry 12. Sequential logic circuitry 14 and combinatorial logic circuitry 16 are commonly coupled for receiving a source of operating potential $V_{SS}$. Switchable power distribution network 12 is an "off-chip" network that may comprise, for example, a controllable voltage regulator that uses bipolar transistors to efficiently supply power to the supply rails or power grids of integrated circuit 10.

In an active operational state or mode, switching circuitry 12 is configured so that sequential logic circuitry 14 and combinatorial logic circuitry 16 are coupled for receiving source of operating potential $V_{DD2}$. In this state, sequential logic circuitry 14 and combinatorial logic circuitry 16 are powered by operating potential $V_{DD2}$. In a suspended operational state or mode, switching circuitry 12 is configured such that sequential logic circuitry 14 is coupled for receiving source of operating potential $V_{DD1}$ from switching circuitry 12, and sequential logic circuitry 14 and combinatorial logic circuitry 16 are decoupled from source of operating potential $V_{DD2}$. The suspended operational mode is also referred to as an idle operational mode. Thus, in the suspended operational state or mode, sequential logic circuitry 14 is coupled for receiving power from $V_{DD1}$, whereas combinatorial logic circuitry 16 is decoupled from $V_{DD2}$ and is therefore powered down. An advantage of powering down combinatorial logic circuitry 16 when operating in the suspended mode is that it lowers any leakage currents associated with the transistors of combinatorial logic circuitry 16, resulting in a power savings.

Figure 2:
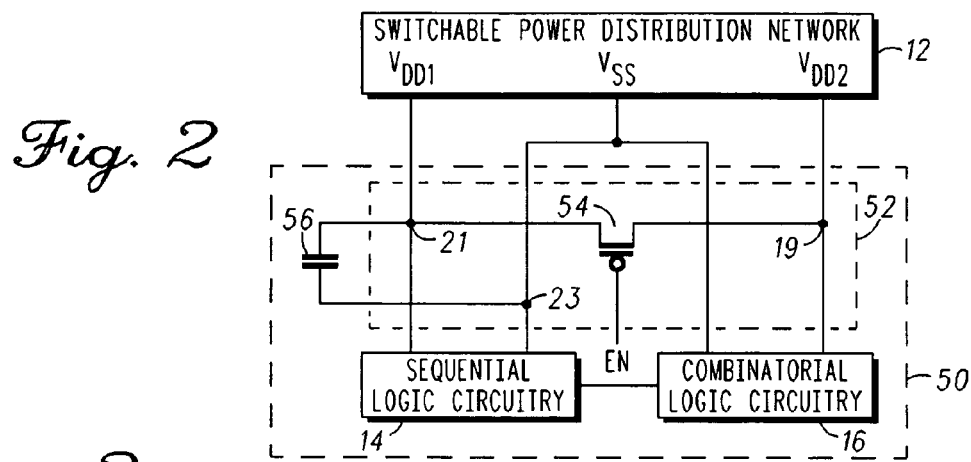
FIG. 2 is a block diagram of an integrated circuit having a switchable power distribution network coupled to sequential logic circuitry and combinatorial logic circuitry in accordance with another embodiment of the present invention.

Referring now to FIG. 2, a block diagram of an integrated circuit 50 having a power boost network 52 coupled to sequential logic circuitry 14 and combinatorial logic circuitry 16 is shown. Sequential logic circuitry 14 and combinatorial logic circuitry 16 have been described with reference to FIG. 1. Sequential logic circuitry 14 and combinatorial logic circuitry 16 are coupled for receiving sources of operating potential $V_{DD1}$ and $V_{DD2}$. In addition, source of operating potential $V_{DD2}$ is coupled to sequential logic circuitry 14 through a P-channel switching transistor 54. Switching transistor 54 is also referred to as a transistor switch. By way of example, P-channel switching transistor 54 has one current carrying terminal coupled to source of operating potential $V_{DD2}$ at node 19 and the other current carrying terminal coupled to sequential logic circuitry 14 at node 21. The gate terminal of P-channel switching transistor 54 is coupled for receiving enable signal EN. Switching transistor 54 boosts the power to sequential logic circuitry 14 when sequential logic circuitry 14 is in an active state as opposed to a suspended state.

A capacitor 56 has a first terminal coupled to $V_{DD1}$ at node 21 and a second terminal coupled to $V_{SS}$ at node 23. Capacitor 56 is preferably a transistor configured as a capacitor and improves the dynamic performance of integrated circuit 52.

In an active operational state, switchable power distribution network 12 is configured so that sequential logic circuitry 14 is coupled for receiving sources of operating potential $V_{DD1}$ and $V_{DD2}$ and combinatorial logic circuitry 16 is coupled for receiving source of operating potential $V_{DD2}$. Sequential logic circuitry 14 is directly coupled for receiving source of operating potential $V_{DD1}$ and coupled through P-channel switching transistor 54 for receiving source of operating potential $V_{DD2}$. In this state, enable signal EN is at a logic low, P-channel switching transistor 54 is in a conducting state, i.e., it is switched on. Thus, sequential logic circuitry 14 receives additional power through source of operating potential $V_{DD2}$.

In a suspended operational state, the complementary enable signal ENB is applied to the gate terminal of P-channel switching transistor 54, thereby decoupling the additional portion of power signal $V_{DD2}$ from sequential logic circuitry 14. In addition, switchable power distribution network 12 is configured so that sequential logic circuitry 14 is coupled for receiving source of operating potential $V_{DD1}$ and decoupled from receiving source of operating potential $V_{DD2}$. Combinatorial logic circuitry 16 is also decoupled from receiving source of operating potential $V_{DD2}$. Thus, in the suspended state of operation, sequential logic circuitry 14 continues to be coupled for receiving a source of operating potential and is therefore "switched on" or powered up, whereas combinatorial logic circuitry 16 is decoupled from source of operating potential $V_{DD2}$ and is therefore "switched off" or powered down.

Figure 3:
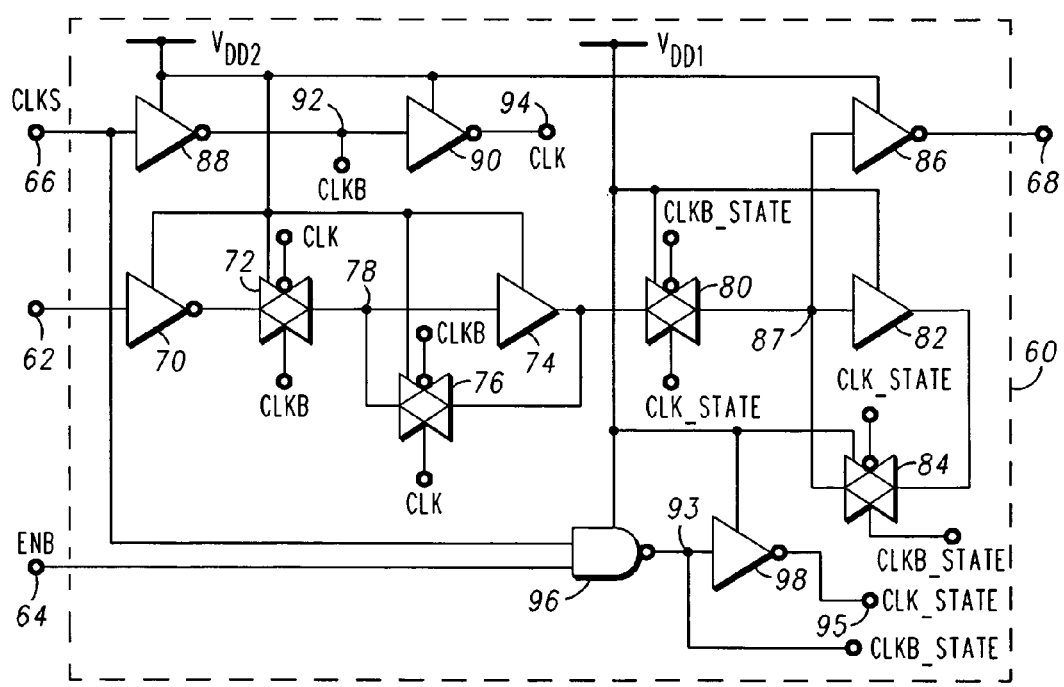
FIG. 3 is a schematic diagram of sequential logic circuitry coupled to a source of operating potential in accordance with another embodiment of the present invention.

FIG. 3 is a schematic diagram of sequential logic circuitry 14 in accordance with an embodiment of the present invention. What is shown in FIG. 3 is sequential logic circuitry 14 that includes a flip-flop 60 having a data input terminal 62, an enable input terminal 64, a clock input terminal 66, and a data output terminal 68. An inverter 70 having an input terminal that serves as data input terminal 62 is connected in series with a passgate 72. Passgate 72 is coupled to the parallel combination of a driver circuit 74 and a passgate 76. An input terminal of driver circuit 74 is connected to an output terminal of passgate 72 and an output terminal of passgate 76 to form a node 78. An output terminal of driver circuit 74 is connected to an input terminal of a passgate 76 and an input terminal of passgate 80. An output terminal of passgate 80 is connected to the input terminal of a buffer circuit 82, an output terminal of a passgate 84, and an input terminal of an inverter gate 86 to form a node 87. The output terminal of buffer circuit 82 is connected to the input terminal of passgate 84. An output terminal of inverter gate 86 serves as output terminal 68 of flip-flop 60. Passgates 72 and 76 have clock input terminals CLK for receiving a non-inverted clock signal and clock terminals CLKB for receiving an inverted clock signal. Pass gates 80 and 84 have clock input terminals CLK_STATE and CLKB_STATE for receiving a non-inverted clock signal and an inverted clock signal, respectively. The use of separate clock signals for pass gates 80 and 84 helps insure the state data contained in passgate 80, buffer gate 82, and passgate 84 is not corrupted by clocking signals from gates that are powered down, e.g., gates 88 and 90.

Inverter gates 70, 88, and 90, passgates 72 and 76, and buffer gate 74 are coupled for receiving source of operating potential $V_{DD2}$. Inverter gates 86 and 98, passgates 80 and 84, buffer gate 82, and NAND gate 96 are coupled for receiving source of operating potential $V_{DD1}$.

A clock distribution circuit comprising a pair of serially connected inverters 88 and 90 delivers the clock signal CLKS appearing at clock input terminal 66 to portions of the internal flip-flop circuitry. The input terminal of inverter 88 serves as clock input terminal 66. An output terminal of inverter circuit 88 is coupled to an input terminal of inverter 90 to form a clocking node 92 that delivers the complementary clock signal CLKB to passgates 72 and 76. An output terminal 94 of inverter 90 delivers the non-complementary clock signal CLK to passgates 72 and 76. For the sake of clarity, the connections between node 92 and the corresponding clocking input terminals of passgates 72 and 76 are labeled rather than shown. Thus, clock signal input terminals of passgates 72 and 76 that are coupled to node 92 are labeled CLKB and the clock signal input terminals of passgates 72 and 76 that are coupled to output terminal 94 are labeled CLK.

Sequential logic circuitry 14 further includes additional clocking circuitry comprising a two-input NAND gate 96 having an input terminal connected to clock input terminal 66, an input terminal that serves as enable input terminal 64, and an output terminal connected to the input terminal of an inverter 98 at node 93. An output terminal 95 of inverter 98 is connected to non-complementary clock input terminal CLK_STATE of passgate 80 and complementary clock input terminal CLKB_STATE of passgate 84. An output terminal of NAND gate 88 is coupled to complementary clock input terminal CLKB_STATE of passgate 80 and non-complementary clock input terminal CLK_STATE of passgate 84. For the sake of clarity, the connections between node 93 and the corresponding clock signal input terminals of passgates 80 and 84 are labeled rather than shown. Thus, the clock signal input terminals of passgates 80 and 84 that are coupled to node 93 are labeled CLKB_STATE and the clock signal input terminals of passgates 80 and 84 that are coupled to output terminal 95 are labeled CLK_STATE.

In an active operational state, switching circuitry such as circuitry 12 shown in FIG. 2 is configured so that sequential logic circuitry 14 is coupled for receiving source of operating potential $V_{DD1}$ and combinatorial logic circuitry 16 is coupled for receiving source of operating potential $V_{DD2}$. In this state, enable signal EN is at a logic low voltage level and P-channel switching transistor 54 is in a conducting or on state. Here, the switch is closed, i.e., P-channel switching transistor 54 is turned on. Thus, source of operating potential $V_{DD2}$ is also coupled to sequential logic circuitry 14. In a suspended operational state, switching circuitry 12 is configured so that source of operating potential $V_{DD2}$ is decoupled from combinatorial logic circuitry 16. Further, in this state a logic high voltage level is applied to the gate terminal of P-channel switching transistor 54 placing it in a non-conducting or off state and ensuring that source of operating potential $V_{DD2}$ is decoupled from sequential logic circuitry 14. Here, the switch is open, i.e., P-channel switching transistor 54 is turned off. In the suspended state of operation, sequential logic circuitry 14 continues to be coupled to source of operating potential $V_{DD1}$, whereas combinatorial logic circuitry 16 is decoupled from source of operating potential $V_{DD2}$ and is therefore powered down.

Figure 4:
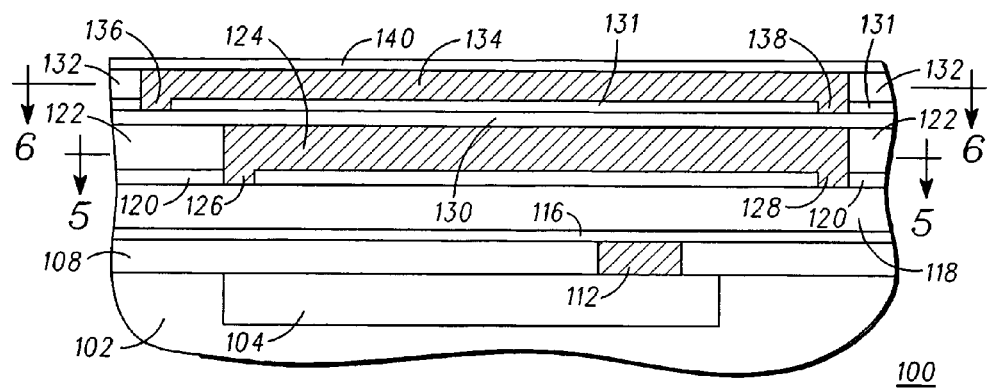
FIG. 4 is a cross-sectional side view of a portion of a semiconductor component during an intermediate stage of manufacture in accordance with an embodiment of the present invention.

FIG. 4 is an enlarged cross-sectional side view of a portion of a semiconductor component 100 during an intermediate stage of manufacture in accordance with an embodiment of the present invention. What is shown in FIG. 4 is a portion of a semiconductor substrate 102 in which a semiconductor device 104 has been fabricated. It should be understood that semiconductor device 104 has been shown in block form and that the type of semiconductor device is not a limitation of the present invention. Suitable semiconductor devices include active circuit elements such as, for example, insulated gate field effect transistors, complementary insulated gate field effect transistors, junction field effect transistors, bipolar junction transistors, diodes, and the like, as well as passive circuit elements such as, for example, capacitors, resistors, and inductors. Likewise, the material of semiconductor substrate 102 is not a limitation of the present invention. Substrate 102 can be silicon, Semiconductor-On-Insulator (SOI), Silicon-On-Sapphire (SOS), silicon germanium, germanium, an epitaxial layer of silicon formed on a silicon substrate, or the like. In addition, semiconductor substrate 102 may be comprised of compound semiconductor materials such as gallium-arsenide, indium-phosphide, or the like.

A dielectric material 108 is formed on semiconductor substrate 102 and an electrical contact 112 is formed in a portion of dielectric material 108. By way of example, electrical contact 112 is metal which electrically contacts semiconductor device 114. Techniques for forming semiconductor devices such as device 104, dielectric material 108, and electrical contact 112 are known to those skilled in the art.

An etch stop layer 116 is formed on dielectric layer 108 and electrical contact 112. Suitable materials for etch stop layer 116 include dielectric materials such as, for example, silicon oxynitride (SiON), silicon nitride (SiN), silicon rich nitride (SiRN), silicon carbide (SiC), hydrogenated oxidized silicon carbon material (SiCOH), or the like. A layer of dielectric or insulating material 118 is formed on etch stop layer 116. Dielectric layer 118 may be a dielectric material having a low dielectric constant or a dielectric material having a high dielectric constant.

An etch stop layer 120 is formed on insulating layer 118. Suitable materials for etch stop layer 120 include dielectric materials such as, for example, silicon oxynitride (SiON), silicon nitride (SiN), silicon rich nitride (SiRN), silicon carbide (SiC), hydrogenated oxidized silicon carbon material (SiCOH), or the like. It should be noted that etch stop layer 120 is an optional layer. In other words, etch stop layer 120 may be absent from semiconductor component 100. A layer of dielectric material 122 is formed on etch stop layer 120.

A power rail or grid 124 is formed from etch stop layer 120 and dielectric layer 122 using for example a Damascene process. Preferably, the conductive material for power rail 124 comprises copper formed over a barrier material such as, for example, tungsten. Vertical plugs 126 and 128 are formed using the Damascene process and allow electrical communication between different electrically conductive layers.

An etch stop layer 130 is formed on power rail 124 and on portions of dielectric layer 122 and an etch stop layer 131 is formed on etch stop layer 130. The materials for etch stop layers 130 and 131 are selected to have different etch rates. A layer of dielectric material 132 is formed on etch stop layer 130.

A power rail or grid 134 is formed from etch stop layer 130 and dielectric layer 132 using for example a Damascene process. Preferably, the conductive material for power rail 134 comprises copper formed over a barrier material such as, for example, tungsten. Vertical plugs 136 and 138 are formed using the Damascene process and serve to allow electrical communication between different electrically conductive layers.

A layer of dielectric material 140 is formed on power rail 134 and dielectric layer 132.

Power rail 124 is electrically isolated from power rail 134 and is coupled for receiving a source of operating potential $V_{DD1}$. Power rail 134 is coupled for receiving a source of operating potential $V_{DD2}$. Preferably, sources of operating potential $V_{DD1}$ and $V_{DD2}$ are at the same voltage level. Preferably, source $V_{DD2}$ is switchably coupled to power rail 134.

Figure 5:
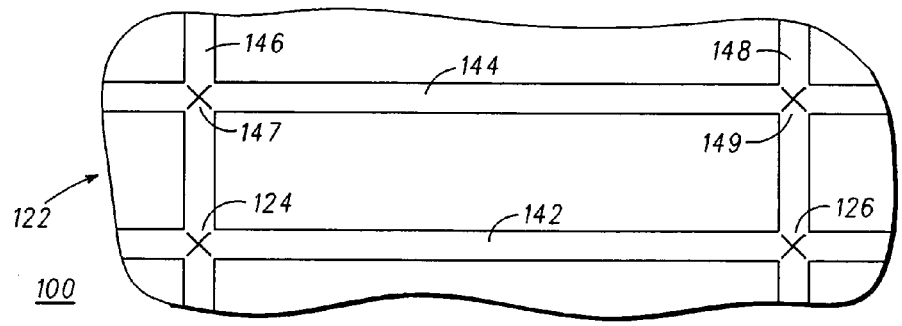
FIG. 5 is a cross-sectional top view of a portion of an upper power supply rail taken along section line 5-5 of FIG. 4.

Referring now to FIG. 5, a cross-sectional top view of a portion of power supply rail 122 taken along section line 5-5 of FIG. 4 is shown. Power supply rail 122 comprises horizontally oriented portions 142 and 144 and vertically oriented portions 146 and 148. Vertically oriented portions 146 and 148 intersect horizontally oriented portion 142 at vertical plugs 124 and 126, respectively. Vertically oriented portions 146 and 148 intersect horizontally oriented portion 144 at vertical plugs 147 and 149. For the sake of clarity, the location of plugs 124, 126, 147, and 149 are indicated in FIG. 5 by X's.

Figure 6:
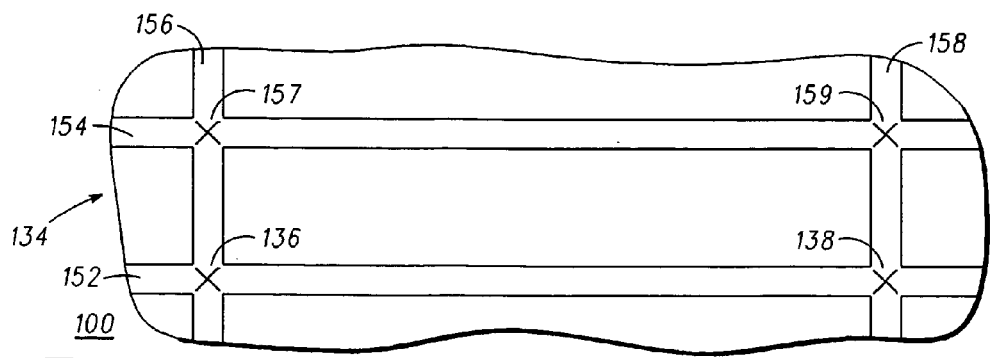
FIG. 6 is a cross-sectional top view of a portion of another upper power supply rail taken along section line 6-6 of FIG. 4.

Referring now to FIG. 6, a cross-sectional top view of a portion of power supply rail 134 taken along section line 6-6 of FIG. 4 is shown. Power supply rail 134 comprises horizontally oriented portions 152 and 154 and vertically oriented portions 156 and 158. Vertically oriented portions 156 and 158 intersect horizontally oriented portion 152 at vertical plugs 136 and 138, respectively. Vertically oriented portions 156 and 158 intersect horizontally oriented portion 154 at vertical plugs 157 and 159. For the sake of clarity, the location of plugs 136, 138, 157, and 159 are indicated in FIG. 6 by X's.

By now it should be appreciated that an integrated circuit having a power savings feature and a method of saving power in the integrated circuit have been provided. In accordance with an embodiment of the present invention, the power savings feature comprises two power grids for supplying power to different functional blocks in the integrated circuit. At least one of the power grids may be inactivated or powered down while the other remains in a powered up state. The power grid that is powered down supplies power to combinatorial logic circuitry. In this type of circuitry, logic states do not have to be saved during idle mode operation. Similarly, sequential circuitry whose logic states do not have to be saved during idle mode operation may be coupled to this power grid. The other power grid is maintained in an active mode and coupled to sequential logic circuitry whose data should be preserved during an idle or suspended mode of operation. Removing power from these functional blocks turns off the transistors comprising the functional blocks thereby eliminating leakage current associated with transistors operating in either an active operational mode or idle operational mode. This invention precludes the need to save and restore data in sequential logic circuitry while this circuitry is in an idle operation mode.

The present invention can be advantageously used in applications in which the circuit elements are configured in a matrix orientation such as, for example, in a memory cell. In this type of application, the switching power grid is configured so that a portion of the rows are coupled for receiving source of operating potential $V_{DD1}$. For example, the power grid coupled for receiving source of operating potential $V_{DD1}$ may be configured so that every tenth row of an array of cells is coupled for receiving source of operating potential $V_{DD1}$. Because not all of the rows are coupled for receiving operating potential $V_{DD1}$, this type of grid is referred to as a "sparse grid." Alternatively, rather forming a sparse power grid across the semiconductor chip, the grid may be configured such that power supply lines are routed to particular cells. Thus, these cells are coupled for receiving source of operating potential $V_{DD1}$. In yet another alternative, a combination of a sparse power grid and direct routing may be employed. For example, every tenth row may be coupled for receiving source of operating potential $V_{DD1}$ via a sparse grid and in addition, a power supply line may be coupled to a cell in a row other than the tenth row, e.g., row four.

Another advantage of the present invention is that it can be included in an integrated circuit without increasing the cost of manufacturing the integrated circuit because it uses processes compatible with integrated circuit manufacture.

Although certain preferred embodiments and methods have been disclosed herein, it will be apparent from the foregoing disclosure to those skilled in the art that variations and modifications of such embodiments and methods may be made without departing from the spirit and scope of the invention. For example, rather than using "off-chip" circuitry to switch between two upper supply sources of operating potential, an "on-chip" switch may be used where the power grid providing power to the sequential logic circuitry provides power to a portion of the sequential logic circuitry, i.e., the power grid provides power only to sequential logic circuitry whose logic state must be preserved during idle mode operation. It is intended that the invention shall be limited only to the extent required by the appended claims and the rules and principles of applicable law.

What is claimed is:

1. An integrated circuit, comprising:
   first and second functional circuit blocks; and
   first, second, and third power supply rails, wherein the first and second power supply rails are upper supply rails and the third power supply rail is a lower power supply rail, wherein the first functional circuit block is electrically coupled to the first power supply rail, the second functional circuit block is electrically coupled to the second power supply rail, and the third power supply rail is electrically coupled to at least one of the first and second functional circuit blocks, wherein the second power supply rail is switchably coupled to a source of operating potential, wherein the first functional block comprises sequential logic circuitry and the second functional circuit block comprises combinational logic circuitry, and wherein a first source of operating potential is coupled to the first functional block and a second source of operating potential is coupled to the first and second functional blocks in an active operational state.

2. The integrated circuit of claim 1, further including a switching element coupled between the first and second power supply rails.

3. The integrated circuit of claim 2, wherein the switching element is a switching transistor.

4. The integrated circuit of claim 1, wherein the second source of operating potential is decoupled from the second functional block in a suspended operational state.

5. The integrated circuit of claim 4, wherein the first source of operating potential is coupled to the first functional block in the suspended operational state.

6. The integrated circuit of claim 2, wherein the switching element couples the second source of operating potential to the first functional block.

7. The integrated circuit of claim 2, wherein the switching element decouples the second source of operating potential from the first functional block in a suspended operational state.

8. The integrated circuit of claim 1, wherein the second power supply rail is switchably coupled to the second source of operating potential.

9. The integrated circuit of claim 1, wherein the first and second sources of operating potential have substantially the same voltage.

10. The integrated circuit of claim 1, further including a capacitor coupled between the first and third power supply rails.

11. The integrated circuit of claim 10, wherein the capacitor comprises a transistor.

12. An integrated circuit, comprising:
    first and second functional circuit blocks, wherein the first function circuit block comprises sequential logic circuitry and the second functional circuit block comprises combinatorial logic circuitry;
    first, second, and third power supply rails, wherein the first functional circuit block is electrically coupled to the first power supply rail, the second functional circuit block is electrically coupled to the second power supply rail, and the third power supply rail is electrically coupled to at least one of the first and second functional circuit blocks, and wherein a first source of operating potential is coupled to the first functional block and a second source of operating potential is coupled to the first and second functional blocks in an active operational state; and
    a switching element coupled between the first and second power supply rails.

* * * * *